United States Patent [19]

Beeman

[11] Patent Number: 5,428,295

[45] Date of Patent: Jun. 27, 1995

[54] FAULT-LOCATOR FOR USE IN LOCATING HIGH-RESISTANCE GROUND FAULTS IN OR ON CONCENTRIC-GROUND ELECTRICAL POWER CABLES

[76] Inventor: Terrence M. Beeman, 183 MacAuley Crescent, Winnipeg, Manitoba, Canada, R2G 0P6

[21] Appl. No.: 145,192

[22] Filed: Nov. 3, 1993

[30] Foreign Application Priority Data

Nov. 4, 1992 [GB] United Kingdom ............... 9223094

[51] Int. Cl.$^6$ .......................................... G01R 27/26
[52] U.S. Cl. ................................ 324/529; 324/522; 324/67
[58] Field of Search ............ 324/509, 527, 529, 522, 324/67, 326

[56] References Cited

U.S. PATENT DOCUMENTS

| | | | |
|---|---|---|---|
| 4,021,729 | 5/1977 | Hudson, Jr. ............... | 324/509 |
| 4,063,161 | 12/1977 | Pardis ....................... | 324/529 |
| 4,283,678 | 8/1981 | Halter ....................... | 324/529 |
| 4,387,337 | 6/1983 | Beeman . | |
| 4,438,389 | 3/1984 | De Sa ....................... | 324/529 |
| 4,438,403 | 3/1984 | Schweitzer, Jr. ........... | 324/529 |
| 4,546,309 | 10/1985 | Kang et al. ................ | 324/509 |
| 5,210,498 | 5/1993 | Paananon .................. | 324/67 |

FOREIGN PATENT DOCUMENTS

| | | | |
|---|---|---|---|
| 0140648 | 8/1983 | Japan ....................... | 324/529 |
| 0170778 | 9/1984 | Japan ....................... | 324/529 |
| 0173174 | 8/1986 | Japan ....................... | 324/529 |
| 0930168 | 5/1982 | U.S.S.R. ................... | 324/529 |

OTHER PUBLICATIONS

IEEE Transactions on Power Apparatus & Systems vol. PAS-99, No. 4 Jul./Aug. 1980 Perry et al.

Primary Examiner—Maura K. Regan
Attorney, Agent, or Firm—Adrian D. Battison; Stanley G. Ade; Murray E. Thrift

[57] ABSTRACT

Faults in electrical coaxial power cables are detected by transmitting a pulsed signal into the cable at a frequency of 512 Hz at an amplitude of the order of 4000 volts peak-to-peak. The capacitance of the cable is adjusted by a separate capacitive tuning box to generate a parallel resonant condition between the transmitter and the cable. These parameters create a condition in which the resistive current generated by the fault is larger than the capacitive/reactive current per foot of the cable enabling detection of the fault by a manually transported receiver dedicated to the frequency of the transmissions.

16 Claims, 2 Drawing Sheets

FAULT-LOCATOR FOR USE IN LOCATING HIGH-RESISTANCE GROUND FAULTS IN OR ON CONCENTRIC-GROUND ELECTRICAL POWER CABLES

This invention relates to a method for detecting high resistance ground faults in concentric electrical power cables.

BACKGROUND OF THE INVENTION

Concentric-ground cable presents several problems to anyone who wants to locate any of its high resistive-ground faults using one of the conventional fault locators presently available. Three of these problems are as follows:

1. Most locators suffer from the shielding effects produced by this type of cable's manufactured co-axial configuration.
2. Most locators suffer from the excessive loading effects put on them by this type of cable's high interconductor capacity.
3. Most locators with their relatively low signal voltages have difficulties detecting the presence of any of this type of cables ground-faults because of their excessively high resistance values result in them producing a very small fault current.

Because of the factors listed above, most magnetically linked fault locators cannot detect the locations of the majority of ground-faults that occur on concentric-ground cables. Consequently the two major methods in use today are pulse reflection (VSWR), and/or high voltage DC thumping (blow-out). Pulse-reflection methods can only locate faults to within 25 to 50 feet, and HV DC thumping, though it is geometrically accurate inflicts considerable damage on the cable. These difficulties have perpetuated the need for a simpler method of detecting the location of a fault in a cable of this type using a device which is readily portable and hence can be carried over a cable path by a walking operator.

Any fault locator system that is going to stand a chance of performing this task must overcome all the problems created by concentric-ground cables, and should also conform to the following basic requirements, that is it should have:

1. A trace-signal generator the output of which maximizes the resistive-fault current of the cable in a way that minimizes the associated capacitive-reactive current of the cable.
2. A trace-signal generator that is portable and capable of operating from some form of a conventional type battery supply.
3. A trace-signal receiver that is exclusively dedicated to the signal of the generating transmitter, thereby offering interference free and noise free operation, plus being portable and battery operated.

Reference is made to the design shown in my earlier U.S. Pat. No. 4,387,337, although this is only because some of the techniques of that patent fit the unique requirements created by concentric-ground cables and their associated high resistance ground-faults.

SUMMARY OF THE INVENTION

It is one object of the present invention to provide a method of detecting faults in a cable of the type mentioned above which gives some or all of the above features and advantages.

According to the invention therefore there is provided a method of detecting, in a length of an electric-power coaxial-cable of the type comprising a central conductor with a dielectric material surrounding the central conductor and a ground return conductor surrounding the dielectric material, high resistance faults in the dielectric material, the method comprising transmitting into the length of cable between the central conductor and the ground return conductor a series of voltage pulses at a predetermined frequency and of a predetermined peak to peak voltage, and then tracing the length of this cable with a receiver arranged to detect electromagnetic field emitted by the cable which is tuned to this predetermined frequency, the peak to peak voltage being sufficiently large and the predetermined frequency being sufficiently low to produce a fault-current from the central conductor to the ground return conductor through the resistive-fault which is large enough to generate a detectable change in the magnetic field around the area of this fault.

Past experience with trying to find high-resistance ground-faults on concentric-ground cable has demonstrated that the location of some of the lowest values among this high resistance fault spectrum could be detected with a low-source-impedance transmitter operating at a 8.3 Khz primary carrier rate, and having signal pulses of around 400 volts peak-to-peak (Vpp). From these limited successes, it has been concluded in the present invention that the only way that the locations of the higher resistance ground-faults might be detected is to use a lower primary carrier rate and to raise the signal voltage of the transmitter.

The lower primary carrier rate requirement results from the fact that a concentric-ground cable's predominate electrical characteristic is the one of a capacitor, and thus the desire to put the cable's per/foot capacitive/reactance figure at an ohms-value that is about two times higher than most of this type of cable's high-resistance ground-faults.

The higher voltage requirement results from the very high-resistance values associated with the majority this type of cable's ground-faults, and the need for a few milliamps of fault current flowing through them in order to make their locations stand a chance of being detected.

In order to meet the special fault-finding requirements created by concentric-ground-cables, this transmitter outputs a 512 Hz (1954 uS) intermittent signal which has its maximum amplitude at around 4000 Vpp. At the start of each one of these 4000 Vpp 512 Hz (1,954 uS) intermittent one cycle bursts the transmitter initially sees the cable as a discharged-capacitor. The initial in-rush of the transmitter's 245 uS long kick or charging-current is limited to an absolute maximum of 60 amps primary or 6.0 amps secondary by the output transformer's primary side's limiting resistance. With most of the cable's expected segment lengths varying between 100 to 2500 feet, the cable's total capacitive equivalent should always be adjusted so that it appears to be around 0.20 uFD. This is accomplished through the use of an separate capacitive tuning box external to the cable. At this relatively constant 0.2 uFD capacitance the transmitter and the cable combine to form a 512 Hz parallel resonant circuit which has a "Q" of about 10. This manually arranged for parallel resonant condition normally nullifies the necessity for the output-transformer's primary side limiting resistor, but its existence is retained to avoid catastrophic conditions, which may be an accidental total short or any other type of non-resonating condition that might occur.

With this 512 Hz resonant condition, it takes more than 20 inches of a cable's length to produce a reactive-current that is similar in size to that produced by one of the highest resistance ground-faults being searched for, (2.2M-ohms). This fault's relatively large resistive-current (2.0 mA), creates quite a noticeable change in the recieved signal strength around the area of its location (3.0 dB). The locator's operator should interpret this approximate 3.0 dB change as the signature of a fault's possible location.

The range of the transmitter's searching frequency could run from a low of about 400 Hz to a high of about 2,500 Hz. As the searching frequency is increased from 400 Hz towards 2,500 Hz, the maximum of the value of the high resistance ground fault that can be detected will decrease from about 2.5M-ohms at 400 Hz, to around 400K-ohms at 2,500 Hz. The ability to detect a high resistance ground fault requires that the cable's per foot capacitive-reactance be higher than the fault's resistance value which is being searched out. If this condition is not met, the operator is not physically able to detect the fault because the length of cable that represents this particular fault's resistance is simply too small or too short to be noticed. Part of this condition has to do with the operator's walking-speed, but it is mainly do to the fact that the dedicated-receiver uses a 2-coil differential antenna system which has its 2 coils operating with about a 12 inch fixed mechanical spacing between them.

The upper limit of the transmitter's searching-voltage has been limited to around 4000 Vpp by all the physical parameters associated with this transmitting unit's hardware, plus a very real concern to limit the hazards involved with this type of a searching voltage. However, at the same time it was necessary to elevate this searching voltage to a 4000 Vpp level in order to created enough fault current through a 2.2M-ohm resistive fault to give it a magnetic-field-value that will allow for its detection. With a searching voltage set at 500 volts a 2.2M-ohm fault current would only be in the area of 230 micro-amps, which is so low as to make detection difficult when you consider this cable's aproximately 95% shielding-effect. If the search-voltage were set at 50 volts, the related 2.2M-ohm fault current would be too low to be detected.

Applying these same fault-current-rules to the lower values of resistive ground faults, (300K-ohms), sets the transmitter's minimum searching-voltage to its approximate 400 Vpp value.

One embodiment of the invention will now be described in conjunction with the accompanying drawings, in which:

DETAILED DESCRIPTION

A General Description of the Transmitter

Figure 1:
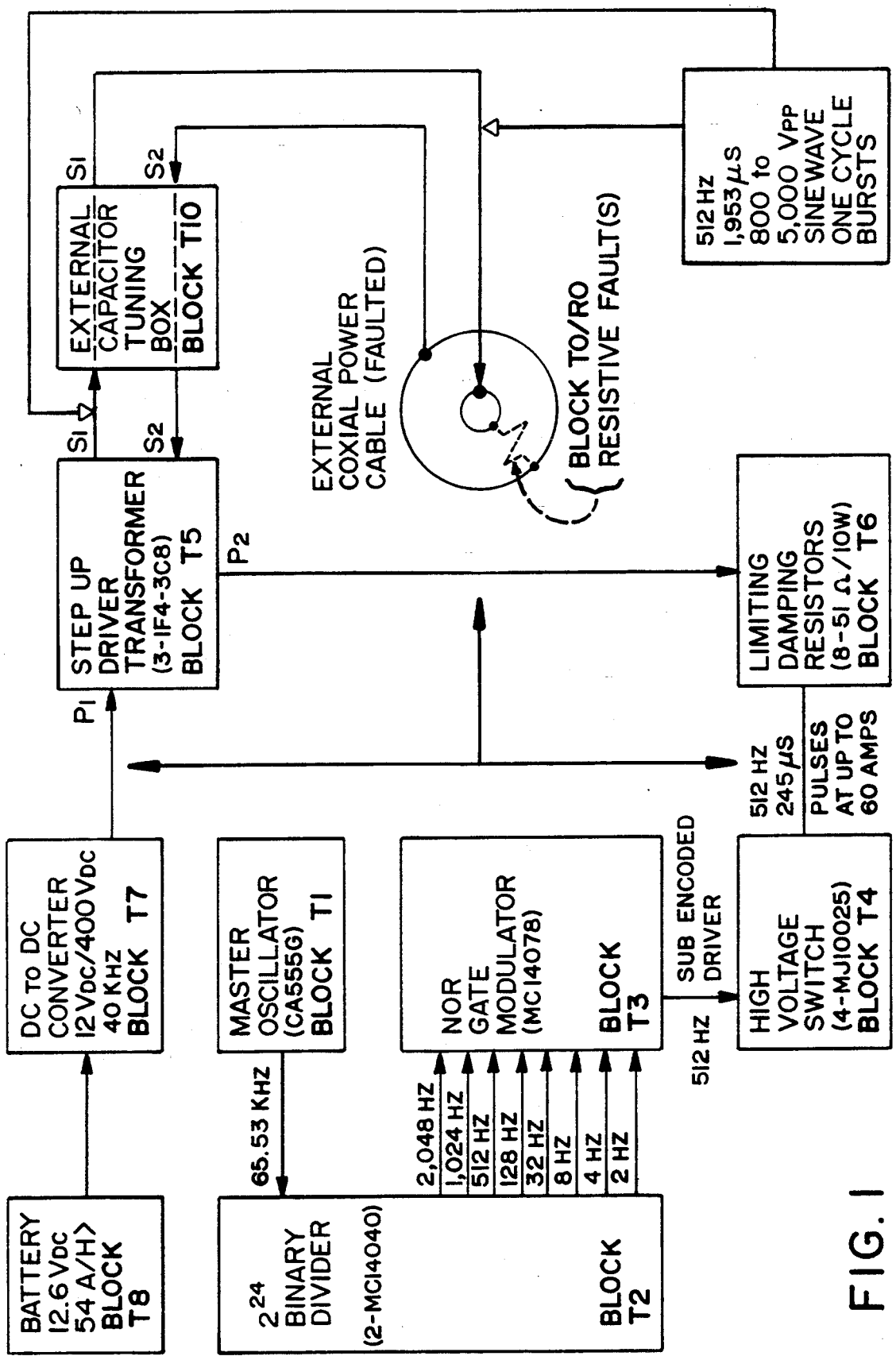
FIG. 1 is a block diagram, or basic circuit layout, of the transmitter, below 6,000 Vpp.
Figure 2:
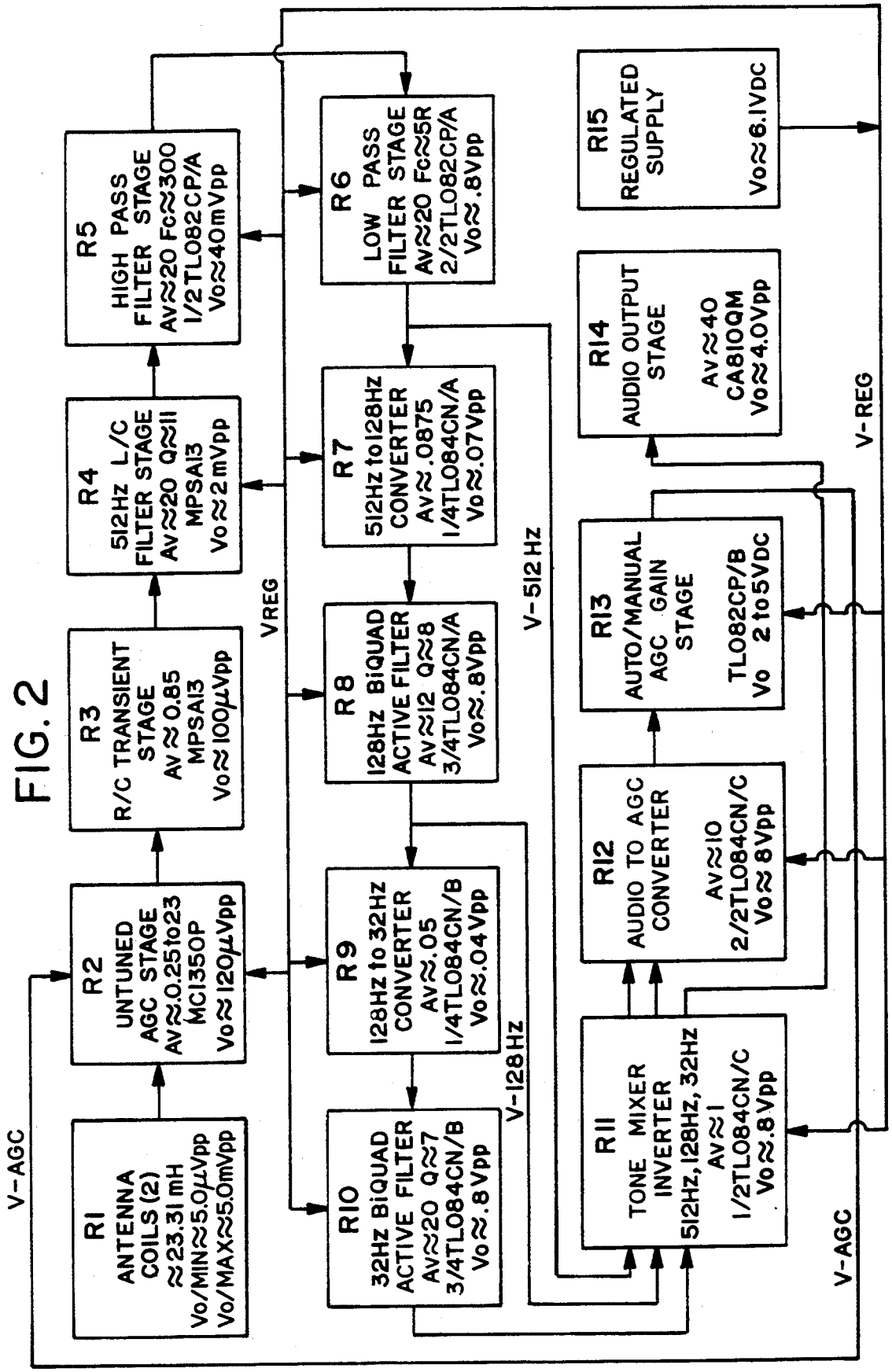
FIG. 2 is a block diagram, or basic circuit layout, of the dedicated receiver.

As stated earlier this transmitter's output is generating a series of square-wave kick-pulses that each have a 245 uS-long-duration, and are being repeated at a primary-carrier rate of 512 Hz, which itself is then being further sub-modulated. Each of these intermittent-pulses will excite the transmitter's and cable's manually-adjusted L/C tank circuit to produce a series of single cycle long 512 Hz oscillations, that can have amplitudes that range from a low of around 600 Vpp, to a high of around 4000 Vpp.

The amplitude variability of this transmitter's 245 uS square wave kick-pulses is done by adjusting the output, (100 Vdc to 400 Vdc), of a 12.6 Vdc DC to DC switching-converter, (block T7), using a transistor switch made from 4 paralleled high-voltage power transistors, (block T4), and a 1 to 10 (ferrox-cube) step-up transformer, (block T5). This 4 transistor power switch will have its current's starting value limited by the output transformer's own inductive characteristic, the nature of a parallel resonant circuit, and failing either of these its absolute maximum value is set or limited by an in-series power-resistor located on the output transformer's primary side (block T6) (6.375 ohms/80 watts). The power resistor's 15.625 watts (time averaged absolute maximum) and each of the 4 transistor switch's 0.004 watts, (time averaged absolute maximum) levels of dissipation are all so determined by this transmitter's modulator (block T3) which enforces its 0.390625% duty-cycle ($\frac{1}{2}$ exponent 8).

In the event that the transmitter's two output-terminals accidentally become shorted requires that this 4 transistor switch be protected from a catastrophic failure, as explained above this is accomplished using the system's in-series limiting resistor and the modulator's 0.390625% duty-cycle.

The transmitter's 245 uS-pulse-width kick, its 512 Hz repeating-rate, and all of its other associated lower modulation rates are obtained through the use of a master oscillator (block T1) some binary division (block T2) and a NOR-Gate or AND-Gate method of modulation (block T3). The modulator's resulting output has a 512 Hz primary carrier kick rate which is then sub-modulated at five other lower frequencies, these being 128 Hz, 32 Hz, 8 Hz, 4 Hz and 2 Hz.

The 512 Hz primary carrier kick rate has been selected to limit the resonating circuit's reactive current which flows through the concentric ground cable being surveyed, to a value that on a per-foot basis is smaller than that flowing through a 3.8M-ohm resistive-fault at the 600 Vpp to 4000 Vpp output level. The fact that 512 Hz has a capacitive/reactance figure in excess of 3.8M-ohm per foot of cable means that when working into the majority of most popular concentric ground cable types, it takes more than a 20 inch length of these types of cables to produce the same magnetic-field effects as a 2.2M-ohm ground-fault.

The North American power line interference is at a minimum because 512 Hz is nearly midway between the 8th and the 9th harmonics of 60 Hz. In Europe with its 50 Hz power-frequency, the primary carrier kick rate could still be 512 Hz, in that 512 Hz is 12.5 Hz (25%) up from the 10th harmonic of 50 Hz, and the 37.5 Hz (75%) down from the 11th harmonic of 50 Hz. These two near midway points are the quietest parts of this portion of the frequency spectrum.

The effect of the eight different binary division encodements that are at the inputs of the modulator (block T3) allow the transmitter to be powered by a 54 A/H to a 100 A/H automotive-battery (block T8). This is mainly due of this modulator's 0.390625% duty-cycle (2 Exponent 8=256) and (1/256=0.390625).

The level of this transmitter's output-power and its powering battery's status are both provided to the operator through the use of a meter and a slide-switch (block T9).

The 512 Hz primary carrier kick rate and the next 2 sub-modulating rates (128 Hz & 32 Hz) allow for a multifiltered staged approach to be used within the design of this system's dedicated receiver.

A General Description of the Transmitter's Associated Capacitive Tuning Box

A capacitive tuning box is the means of creating the transmitter's, cable's and receiver's required 512 Hz resonant signal condition. Rather than adjusting the capacitance of this L/C Circuit to obtain this required 512 Hz resonating condition, it is also possible to vary the transformer's equivalent parallel inductance. This variable inductive characteristic could be most easily be accomplished by mechanically varying this output transformer's core's presently fixed air-gap.

As it presently stands this capacitive tuning box (block T10), consists of 5 high voltage capacitors (5,000 Vdc) and a high-voltage four layer nine position rotary-switch (3000 Vac). This four layer rotary-switch allows for arranging these five capacitors (4—0.05 uFD and 1—0.1 uFD), so that you can get nine different capacitive settings. These nine different rotary switch's settings provide for a capacitive constant that is always within about plus or minus 6% of the 0.2 uFD 512 Hz resonant ideal.

In terms of physical cable lengths this plus or minus 6% represents a cable's length that is always within about 139 feet of the 2,500 foot design's ideal.

A General Description of How a Concentric-Ground Power Cable's Environment Works with the Dedicated Receiver The strength of the receiver's 2-coil differential antenna's pick-up is directly connected to the difference between the strengths of the concentric-ground cable's two opposing magnetic-fields, which are being created by the center conductor's outgoing pulsed current and the outer conductor's (sheath's), returning pulsed current. When two absolutely equal currents are going in opposite directions within a very small area, they create two absolutely equal magnetic-fields, which then totally cancel each other. However, because of the manner in which concentric-ground power cables are constructed this total cancellation doesn't ever take place. Most concentric ground cables only come to within a 95% maximum of this total cancellation.

The strength of the difference between these two opposing magnetic-fields is also proportional to any differences between the cable's center conductor's outgoing pulsed current and the outer conductor's (sheath's) incoming pulsed current. This is important because slightly before, and consistently after, any of a cable's resistive ground fault's locations this current level difference changes first positively and then negatively. This is due to the way in which the fault's resistive leakage-to-ground of some of the center conductor's outgoing current returns to that cable sheath's incoming current from that same ground. Because of these factors, the dedicated receiver has the possibility of detecting the location of high-resistance ground-faults.

In that this receiver uses a 2-coil differential antenna (block R1), the induced current difference that exists between or across these two coils is related to the signal's 600 Vpp to 4000 Vpp output level, the cable's 95% cancellation effects, and the 12 inches of fixed mechanical spacing that always exists between these two differentially connected coils, plus any other differences that might exist such as resistive cable faults. With a 4000 Vpp signal and the differential antenna's 12 inch coil spacing this induced current difference starts out as being related to transmitted signal's voltage divided by the cable's per foot capacitive-reactance at 512 Hz, or 4000 Vpp 3,885,618 ohms, which yields about 0.001 amps. With the 95% cancellation effect this induced current difference becomes reduced to 0.000051 amps. Other than in the area of a resistive ground-fault, this 0.000051 amps of induced current-difference remains constant over the length of the cable due to this differential antenna coil's constant 12 inch spacing configuration.

When working with a 4000 Vpp/1,954 uS signal and a large high-resistance ground-fault (2.2M-ohm) these combine to produce about a 2.0 mA resistive-type fault-current. In a two foot area surrounding this 2.2M-ohm fault's location this 2.0 mA of resistive current causes the cable to exhibit about a 2 times larger differential than is found in all the other non-faulted per/foot lengths of the cable. This extra 2 times per/foot current difference will cause the receiver's audio volume and its meter's signal strength reading to rise and then fall back by as much, if not more, than 3.0 dB. This is because that 0.002 mA of extra-fault-current over this 2 foot area causes the cable's cancellation effect's current differential to momentarily increase from its normal 0.000051 amps to about 0.00010 amps Because resistive ground-faults can have values from under 100K-ohms to over 2.2M-ohms, it is necessary to operate the transmitter's switching supply (block T7) at one of four different settings. These four fixed switching supply's settings are as follows:

100 Vdc about 1,000 Vpp pulses (for under 0.5M-ohm resistive-faults).
200 Vdc about 2,000 Vpp pulses (for under 1.0M-ohm resistive-faults).
300 Vdc about 3,000 Vpp pulses (for under 1.5M-ohm resistive-faults).
400 Vdc about 4,000 Vpp pulses (for over 1.5M-ohm resistive-faults).

A General Description of the Dedicated Receiver

Block R1, the Differential Antenna System

This system's dedicated receiver uses 2 series tuned (Q of 1.0) coils (23.31 mH each) connected in a differential-antenna configuration (block R1). This antenna converts the concentric ground cable's (block R0 or T0) radiating magnetic-field, that has being created by this system's transmitter's series of intermittent 512 Hz resonant-current-pulses, back into an induced voltage. The expected range of this antenna's induced voltages can vary from a low of 5 micro-volts pp (5.0 uV/pp) to a high of 5 milli-volts pp (5.0 mVpp or 5000 uVpp). This represents a span of 1 to 1,000.

Block R2, the Un-tuned AGC Stage

The 1E3 variation of this antenna's induced-output is either compressed, or amplified, by an untuned fully differential Op-Amp (block R2), whose forward gain can be varied from a LOW of 0.023 to a HIGH of 23. This gain-variation is done through the use of a time-delayed DC voltage, which is feedback from the output of block R13. It takes this system approximately 1.0 minute to react to a 3.0 dB change in the antenna's induced output. The function of this automatic gain control voltage feedback is to try to keep this stage's amplified output voltage at a constant 120 uVpp. This MC1350P chip's 120 uVpp output acts as the input into the transient suppression stage (block R3).

Block R3, the Transient Suppression Stage

Block R3, which is an emitter-follower, has a gain of about 0.85, and its resulting output is around 100 uVpp. This 100 uVpp of output drives the filter stage shown in block R4.

Block R4, the 512 Hz L/C Filter Stage

Block R4 is a conventional-type of a tuned transformer which resonates at 512 Hz. This stage's gain is fixed at 20, and its tuned transformer's filtering action has a Q of about 11. This stage's output voltage is around 0.002 Vpp, and is used to drive the filter stage in block R5.

Block R5, the High-Pass Filter Stage

Block R5 is a dual Op-Amp type of high-pass-filter, that has a gain of about 20 and a corner frequency of around 300 Hz. The output voltage of this stage at 0.04 Vpp drives the low pass filter of block R6.

Block R6, the Low-Pass Filter Stage

Block R6 is a another dual Op-Amp filter that functions in a low pass manner. This low pass stage's corner frequency is about 5,000 Hz, and with its gain at 20 it provides about 0.8 Vpp drive for the frequency converter of block R7. It also provides the 512 Hz drive component for the audio-mixer of block R11.

With block R2's antenna's input running as low as 5.0 uVpp and with block R6's output at 0.8 Vpp, means that this 512 Hz portion of the receiver ends up having a maximum-forward voltage gain of 160,000. And when R2's antenna's input is as high as 5.0 mVpp means that this 512 Hz portion of the receiver ends up having a minimum forward voltage gain of 160.

Block R7, the 512 Hz to 128 Hz Wave-Shaper Stage

Through the use of a R/C network, a Schottky diode, and a Op-Amp R7 converts block R6's intermittent sub-encoded 512 Hz 0.8 Vpp input into a triangular-shaped 128 Hz output which has a 0.07 Vpp amplitude. This 0.07 Vpp 128 Hz output is used to drive the filter stage of block R8.

Block R8, a 128 Hz Active Filter Stage

Block R8 uses 3 Op-Amps to make a 128 Hz bi-quad active filter. This filter's Q is about 8, and its forward gain is around 12. With a gain at around 12 this filter's 0.8 Vpp 128 Hz sub-encoded output is used to drive the 32 Hz wave shaper block R9. It also provides the 128 Hz drive component for the audio-mixer of block R11.

Block R9, the 128 Hz to 32 Hz Wave-Shaper Stage

Block R9, like block R7 uses a R/C network, a Schottky diode, and a Op-Amp to convert R8's intermittent sub-encoded 128 Hz 0.8 Vpp input into a triangular-shaped 32 Hz output, which has a 0.04 Vpp amplitude. This 0.04 Vpp 32 Hz output drives the filter stage of block R10.

Block R10, a 32 Hz Active Filter Stage

The 32 Hz filtering-action of block R10 has a Q at about 7, and a forward gain of 20. With an output of 32 Hz 0.8 Vpp, R10 provides the 32 Hz drive component for the audio mixer (block R11).

Block R11, the Audio-Mixer Stage

Block R11 uses an Op-Amp to resistively mix the three different 0.8 Vpp outputs of this receiver's three filter-stages into a single composite output having an amplitude of 0.8 Vpp. The 0.8 Vpp amplitude of this composite output tends to react as if it had the summed Q of its 3 different filtered stage's inputs, (11+8+7=26). This stage's 32 Hz/128 Hz/512 Hz composite output acts as the input to blocks R12, R13 and R14.

Blocks R12 And R13, The Audio to AGC Converter and AGC's Auto/Manual Stage

The input-transistor of block R12 takes the 0.8 Vpp composite input from block R11 and splits it into an in phase and an inverted output. Then these two equal but 180 degrees out of phase components are each amplified by a factor of 10, using two more Op-Amps. The 8.0 Vpp outputs of these two Op-Amps is rectified and stored as a DC voltage in a capacitor. This rectified DC voltage acts as the AGC input source for block R13. Block R13 uses an Op-Amp's integration abilities to produce the AGC system's 60 second time-delay. Block R13 then uses another Op-Amp to produce the AGC system's required Auto/Manual AGC voltage feature.

Block R14, the Audio Output Stage

The 0.8 Vpp output of block R11 is also fed into R14 through a manually adjusted volume potentiometer. Block R14 having a forward voltage-gain of 40, can amplify its manually adjusted composite input into as much as a 10 Vpp/1.0 watt composite output, depending on where this receiver unit's volume potentiometer has been set. The normal 4.0 V/pp-output of block 14 is used to drive the receiver's speaker/earphones, (not shown), and the signal/strength meter (not shown).

The receiver's output stage's audio volume is first adjusted (manually), using the volume-potentiometer (not shown). However, a change in the received signal strength, or a manual re-adjusting of the front end's AGC controlled gain also effects this audio volume's setting.

The visual-representation of the instantaneous signal strength is provided through the use of a 0 to 1.0 mA DC meter (not shown). This reading is first adjusted with the volume potentiometer's setting (not shown), and is then mainly altered by changes in the instantaneous signal strength, and secondarily by any manual re-setting of the front-end gain's AGC voltage (block R13). The meter that is used for this signal strength reading is also used to display the status of the receiver's 12.6 Vdc-1.8 A/H GelCell battery's charge (not shown) through the use of a selecting switch.

When this receiver's AGC-gain and its volume potentiometer are both at their maximum settings, its maximum forward gain becomes 6,400,000 (160,000*40=6,400,000).

Block R15, the 6.1 Vdc Regulated Supply Stage

Block R15 converts the 10.0 Vdc to 12.6 Vdc output of the receiver's 1.8 A/H GelCell, (not shown), into a 6.1 Vdc regulated voltage. The 6.1 Vdc regulated output of block R15 is used in various ways by stages R2, R4, R5, R6, R7, R8, R9, R10, R11, R12 and R13.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

I claim:

1. A method of detecting faults in an electric power cable comprising providing an electric power cable including a central conductor with a dielectric material surrounding the central conductor and a ground return conductor surrounding the dielectric material, the cable having high resistance faults of a resistance of greater than 50K-ohms transmitting into the length of cable between the central conductor and the ground return conductor a series of sequential voltage pulses, each pulse formed by a oscillating wave form at a predetermined single, fixed frequency less than 2,500 Hz and of a predetermined, constant peak to peak voltage greater than 400 volts and less than 8,000 volts, tracing the length of this cable with a receiver arranged to detect an electromagnetic field emitted by the cable which is tuned to this predetermined, fixed, single frequency, and selecting the peak to peak voltage and the predetermined frequency to produce in the high resistance faults a fault-current from the central conductor to the ground return conductor through the fault which is large enough to generate a detectable change in the magnetic field around the area of this fault.

2. The method according to claim 1 wherein the peak-to-peak voltage lies in the range of 800 volts to 6,000 volts.

3. The method according to claim 1 wherein the fault has a resistance less than 3.0M-ohms.

4. The method according to claim 1 wherein the predetermined frequency is selected so as to avoid electrical or electronic interference from the 50 or 60 cycle power frequencies.

5. The method according to claim 1 wherein the predetermined frequency is 512 Hz.

6. The method according to claim 1 wherein each pulse has a power of the order of 16,000 watts from a transmitter powered from a supply of the order of a 12.6 volt DC-54 AMP/HOUR automotive type battery.

7. The method according to claim 6 which uses NOR-GATE or AND-GATE modulation to generate the pulses.

8. The method according to claim 1 wherein the receiver includes a multi-filtered/staged receiver which is dedicated exclusively to matching transmitter's unique signal pattern.

9. The method according to claim 8 wherein the transmitter uses NOR-GATE or AND-GATE modulation.

10. The method according to claim 1 wherein the transmitter is arranged to provide with the cable a resonant circuit condition.

11. The method according to claim 10 wherein the transmitter uses a capacitive tuning box external to the cable to achieve the resonant condition.

12. The method according to claim 1 wherein pulses are arranged such that the resistive current generated by the fault is larger than the capacitive/reactive current per foot of the cable.

13. The method according to claim 12 wherein the transmitter includes a low-impedance, high-voltage source as a resonant (L/C) tank circuit driver.

14. The method according to claim 13 wherein the driver acts as a short (R/C) time constant current source for the resonant exciting of the capacity of the cable.

15. The method according to claim 1 wherein the receiver includes a 2-coil differential antenna system which has two antenna coils operating with a fixed mechanical space therebetween of the order of 12 inches.

16. The method according to claim 10 wherein the transmitter is arranged so as to provide with the cable a capacitive constant that is always within about plus or minus 6% of the 0.2 uFD resonant ideal when the predetermined frequency is 512 Hz.

* * * * *